United States Patent

Chevallier et al.

[19]

[11] Patent Number: 5,959,897
[45] Date of Patent: Sep. 28, 1999

[54] SYSTEM AND METHOD FOR WRITING DATA TO MEMORY CELLS SO AS TO ENABLE FASTER READS OF THE DATA USING DUAL WORDLINE DRIVERS

[75] Inventors: Christophe J. Chevallier, Palo Alto; Vinod C. Lakhani, Milpitas; Robert D. Norman, San Jose; Darrell D. Binerson, Cupertino, all of Calif.

[73] Assignee: Micron Technology, Inc., Boise, Id.

[21] Appl. No.: 09/098,104

[22] Filed: Jun. 16, 1998

Related U.S. Application Data

[63] Continuation of application No. 08/709,555, Sep. 6, 1996.
[51] Int. Cl.$^6$ ........................................... G11C 7/00
[52] U.S. Cl. .............................. 365/185.33; 365/185.11; 365/230.03; 365/230.04
[58] Field of Search ........................ 365/185.33, 185.11, 365/230.03, 230.04, 230.06

[56] References Cited

U.S. PATENT DOCUMENTS

| | | | |
|---|---|---|---|
| 4,982,372 | 1/1991 | Matsuo ................................ | 365/230.03 |
| 5,089,992 | 2/1992 | Shinohara ........................... | 365/230.04 |
| 5,517,457 | 5/1996 | Sakui et al. ........................ | 365/230.04 |
| 5,708,623 | 1/1998 | Choi ................................... | 365/230.04 |
| 5,798,968 | 8/1998 | Lee et al. ........................... | 365/185.11 |

*Primary Examiner*—Vu A. Le
*Attorney, Agent, or Firm*—Schwegman, Lundberg Woessner & Kluth P.A.

[57] ABSTRACT

A memory system including an array of memory cells (e.g., flash memory cells) connected along wordlines and bitlines, two physically separated sets of wordline drivers (each for driving a different subset of the wordlines), and circuitry for writing data to selected cells connected along a selected wordline, where the cells are selected to be near the wordline driver for the wordline, to reduce the time needed for subsequent reads of the data, and a method implemented by such system. To write a sector of data (consisting of packets of the data) to cells connected along a wordline, the system preferably writes the first packet (or the first N bits of the first packet) to the cells which are physically nearest to the wordline driver which drives the wordline. In some embodiments, one set of wordline drivers (positioned along one side of the array) drives the even-numbered wordlines, another set of wordline drivers (positioned along the opposite side of the array) drives the odd-numbered wordlines, and the system exchanges the bitline addresses of the first packet and last packet (or the first N bytes of the first packet and the last N bytes of the last packet) of each sector to be written to cells along an even-numbered wordline (or inverts the bitline addresses for the entire sector), but the system does not modify the bitline address of any of data bit to be written to cells connected along an odd-numbered wordline. Preferably, the system is operable in either a first mode in which it modifies the addresses to which data is to be written to a cell array (to reduce the time needed to read the data after it has been written) or a second mode in which it does not modify the addresses to which the data is to be written to the array.

18 Claims, 6 Drawing Sheets

SYSTEM AND METHOD FOR WRITING DATA TO MEMORY CELLS SO AS TO ENABLE FASTER READS OF THE DATA USING DUAL WORDLINE DRIVERS

This application is a continuation of U.S. Pat. application Ser. No. 08/709,555, filed Sep. 6, 1996.

BACKGROUND OF THE INVENTION

1. Field of the Invention

The invention pertains to a memory system having an array of memory cells connected along wordlines and bitlines, and two physically separated sets of wordline drivers for driving the wordlines (for example, a flash memory system of this type which includes an array of flash memory cells and emulates a magnetic disk drive). More specifically, the invention pertains to a method and system for determining memory cells to which data is to be written (where the cells are connected along bitlines, and wordlines driven by two physically separated sets of wordline drivers), so as to reduce the time needed to read the data from the cells.

2. Description of Related Art

It is conventional to implement a memory system as an integrated circuit which includes an array of flash memory cells (or other non-volatile memory cells) and circuitry for independently erasing selected blocks of the cells, programming selected ones of the cells (i.e., writing data to selected ones of the cells), and reading data from selected ones of the cells. FIG. 1 is a simplified block diagram of a flash memory system (flash memory system 3) which is designed to emulate a magnetic disk drive system. Although system 3 can be implemented as a single integrated circuit, it is not necessarily implemented as a single integrated circuit, and the following description of system 3 will not assume that it is an integrated circuit. Flash memory system 3 of FIG. 1 includes memory cell array 16, which comprises rows and columns of flash memory cells (each row of cells connected along a different wordline, and each column of cells connected along a different bitline). Flash memory system 3 also includes row decoder circuit (X address decoder) 12, which includes two physically separated sets of wordline drivers: a first set of wordline drivers 12A (positioned physically nearest to the bitline on the left side of array 16, which will be denoted the "first" bitline), and a second set of wordline drivers 12B (positioned physically nearest to the bitline on the right side of array 16, which will be denoted the "last" bitline).

We will refer to the wordlines of array 16 as being numbered consecutively from top to bottom of array 16, so that the wordlines are: wordline 0 (or "WL0"), wordline 1 (or "WL1"), wordline 2, . . . , wordline X-1, and wordline X (where X is an odd integer as shown in FIG. 2). Thus the wordlines include even-numbered wordlines (e.g., wordline 2) and odd-numbered wordlines (e.g., wordline 1). Of course, array 16 could alternatively be implemented with an odd number of wordlines.

FIG. 2 is a schematic diagram of an implementation of memory array 16 of FIG. 1 (which is a memory array suitable for reading and writing data in accordance with the present invention). Array 16 includes flash memory cells 14A through 14S (collectively referred to as cells 14) arranged in rows and columns. Each cell 14 is implemented by a floating-gate N-channel transistor, as shown schematically. All the cells 14 in a particular column have their drain regions connected to a common bitline (one of bitlines BL0 through BLN) and all the cells in a particular row have their control gates connected to a common wordline (one of wordlines WL0 through WLX). All of cells 14 have their sources connected to a common source line SL. Alternatively, it is possible to arrange the cells into array segments having separate source lines that can be sequentially accessed during an erase cycle (e.g., to reduce the maximum erase current).

Cells 14 of array 16 are arranged in column pairs, with the cells of each pair sharing a common source region. By way of example, the pair consisting of cells 14J and 14K has a common source region connected to the source line SL. The drain region of each cell 14 is connected to the bitline (one of BL0 through BLN) associated with the column in which the cell is located. By way of example, each of cells 14H, 14I, 14J, 14K, 14L, and 14M has its drain region connected to bitline BL1.

The wordlines of array 16 of FIG. 2 are driven by two physically separated sets of wordline drivers: a first set of wordline drivers 12A (positioned physically nearest to bitline BL0), and a second set of wordline drivers 12B (positioned physically nearest to bitline BLN). Each of the control gates of each of the cells connected along the even-numbered wordlines (wordlines WL0, WL2, . . . WLX-1) is driven by a driver circuit D within set 12A (i.e., each driver circuit D within set 12A asserts an appropriate control voltage to each such control gate). Each of the control gates of each of the cells connected along the odd-numbered wordlines (wordlines WL1, WL3, . . . WLX) is driven by a driver circuit D within set 12B (i.e., each driver circuit D within set 12B asserts an appropriate control voltage to each such control gate).

With reference again to FIG. 1, the drivers comprising set 12A are positioned along the left side of array 16 and are connected to the control gates of each of the flash memory cells of array 16 that are connected along the even-numbered wordlines of array 16, and the drivers comprising set 12B are positioned along the right side of array 16 and connected to the control gates of each of the cells connected along the odd-numbered wordlines of array 16. This arrangement of drivers 12A and 12B provides most efficient use of the area of system 3, allowing system 3 to be implemented with a smaller overall size than if all of drivers 12A and 12B were positioned on the same side of array 16.

To enable a conventional flash memory system such as system 3 to implement the present invention, it would need to be modified to include circuitry for modifying bitline addresses of a selected subset (e.g., one or more selected packets) of a set of data to be written to any selected row of the cells of array 16, in accordance with the invention (in a manner to be explained below).

For convenience throughout this disclosure, we use the following notation to describe address bits. "A(Y:Z)" denotes a set of (Y–(Z-1)) address bits, consisting of binary bits $A_Y, A_Y, \ldots A_{Z+1}$, and $A_Z$. For example, A(8:0) denotes the following nine address bits: $A_8, A_7, A_6, A_5, A_4, A_3, A_2, A_1$, and $A_0$.

With reference again to FIG. 1, memory system 3 also includes control engine (or "controller") 29, output buffer 10, input buffer 11, and host interface 4. Host interface 4 asserts data from output buffer 10 (e.g., data read from array 16) to an external device (not shown), and asserts input data from the external device to input buffer 11 (so that such input data can be written to array 16). Alternatively, where host interface 4 includes input and output data buffers, buffers 10 and 11 can be eliminated and the data buffers within interface 4 used in place of them.

Host interface 4 also includes an address buffer for receiving external address bits from the external device, and is configured to send buffered address bits (including bits identifying cylinder, head, and sector addresses) to controller 29 in response to receiving external address bits from the external device. Host interface 4 also generates control signals in response to external control signals received from the external device and asserts the control signals to controller 29.

Where the external device is a host processor having a standard DOS operating system with a PCMCIA-ATA interface (for communicating with a magnetic disk drive system), interface 4 should also comply with the PCMCIA-ATA standard so that it can communicate with the standard PCMCIA-ATA interface of the external device.

In addition to row decoder circuit 12, system 3 also includes column multiplexer (Y multiplexer) circuitry, comprising: Y-decoder circuit 13A; and one subset of Y Multiplexer circuitry for each main block of array 16 (e.g., circuit YMuxA for main block 16A, circuit YMuxB for main block 16B, and circuit YMuxH for main block 16H).

In response to receiving the above-mentioned address bits (including bits identifying cylinder, head, and sector addresses) from interface 4, control engine 29 generates translated address bits A(21:0) and address bit AX and asserts the translated address bits (and bit AX) to row decoder 12 and Y decoder circuit 13A.

Each of the cells (storage locations) of memory array circuit 16 is indexed by a row index (an "X" index determined by decoder circuit 12) and a column index (a "Y" index determined by Y decoder circuit 13A). As described with reference to FIG. 2, each column of cells of array 16 comprises "X" memory cells (where X is an integer), with each cell implemented by a single floating-gate N-channel transistor. The drains of all transistors of a column are connected to a bitline, the control gate of each of the transistors is connected to a different wordline, and the sources of the transistors are held at a source potential (which is usually ground potential for the system during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. Where each of the N-channel transistors is a flash memory device, the charge stored on the floating gate of each is erasable (and thus the data value stored by each cell is erasable) by appropriately changing the voltage applied to the gate and source (in a well known manner). In memory systems comprising an array of non-volatile memory cells other than flash memory cells, such non-volatile cells are erased using other techniques which are well known.

As noted, system 3 emulates a conventional magnetic disk drive system. Accordingly, the cells of array 16 are addressed in a manner emulating the manner in which conventional magnetic disk storage locations are addressed. System 3 can be mounted on a card for insertion into a computer system. Alternatively, variations on system 3 (which lack array 16 and instead include a flash memory interface for interfacing with one or more separate memory array circuits) can be implemented as part of a card (for insertion into a computer system), where the card has a chip set mounted thereon, and the chip set includes a controller chip and several memory chips controlled by the controller chip. Each memory chip implements an array of flash memory cells.

The dominant computer operating system known as "DOS" (Disk Operating System) is essentially a software package used to manage a disk system. DOS has been developed by IBM Corporation, Microsoft Corporation, and Novell as the heart of widely used computer software. The first generation of Microsoft Corporation's "Windows" operating system software was essentially a continuation of the original DOS software with a user friendly shell added for ease of use.

The DOS software was developed to support the physical characteristics of hard drive structures, supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead bits associated with mass storage, such as ECC (error correction code) bits. A key to this development is to make the flash memory array respond to a host processor in a manner that looks like a disk so the operating system can store and retrieve data in a known manner and be easily integrated into a computer system including the host processor.

In some flash memory systems that emulate the storage characteristics of hard disk drives, the interface to the flash memory is identical to a conventional interface to a conventional magnetic hard disk drive. This approach has been adopted by the PCMCIA standardization committee, which has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interface, but must include an onboard controller which manages each flash memory array independent of the host system.

Since system 3 of FIG. 1 emulates a magnetic disk drive, above-mentioned address bits A(21:0) and AX determine cylinder, sector, and packet addresses of the type conventionally used in magnetic disk drive systems. In one implementation, array 16 of FIG. 1 has 544 bytes per row of flash memory cells (each byte consisting of eight bits, and each memory cell is capable of storing one bit). Each row of cells is equivalent to a magnetic disk "sector" (512 bytes of data plus 32 bytes of "overhead").

In such an implementation, array 16 is partitioned into eight large "decode" blocks (sometimes referred to as "main" blocks) of cells (schematically indicated in FIG. 1). The decode blocks are physically isolated from one another. This partitioning of blocks allows defects in one decode block to be isolated from the other decode blocks in the array, allows defective decode blocks to be bypassed by a controller, and allows for high usage of die and enhances overall yield of silicon produced (driving down the cost of flash mass storage systems).

Array 16 of FIG. 1 includes eight decode blocks (blocks 16A, 16B, 16C, 16D, 16E, 16F, 16G, and 16H, which are also referred to herein as "main blocks," and of which only blocks 16A, 16B, and 16H are shown in FIG. 1). Y-select gate circuitry is provided for each decode block of array 16. Specifically, Y-select gate circuitry YMuxA is provided for selecting columns of decode block 16A in response to indices received from circuit 13A, Y-select gate circuitry YMuxB is-provided for selecting columns of decode block 16B in response to indices received from circuit 13A, Y-select gate circuitry YMuxH is provided for selecting columns of decode block 16H in response to indices received from circuit 13A, and five other subsets of Y-select gate circuitry (not separately shown) are provided for selecting columns of the other decode blocks (blocks 16C, 16D, 16E, 16F, and 16G) in response to indices received from circuit 13A.

Each decode block is subdivided into a number (e.g., eight) of independently erasable blocks, sometimes referred to herein as "erase blocks." Each erase block consists of rows of flash memory cells, each row being capable of storing seventeen "packets" of binary bits, each packet consisting of 32 bytes (each byte consisting of eight binary bits). Thus, each row (capable of storing 544 bytes) corresponds to one conventional disk sector (comprising 544 bytes), and each row can store 512 bytes of data of interest as well as 32 ECC bytes for use in error detection and correction (or 32 "overhead" bytes of some type other than ECC bytes, or a combination of ECC bytes and other overhead bytes).

Each erase block is divided into two blocks of cells known as "cylinders" of cells (in the sense that this expression is used in a conventional magnetic disk drive), with each cylinder consisting of 256K bits of data organized into 64 sectors (i.e. 64 rows of cells). Thus, each erase block in the FIG. 2 example consists of 128 sectors (i.e., 128 rows of cells).

Each erase block can be independently erased in response to signals from controller 29. All flash memory cells in each erase block are erased at the same (or substantially the same) time, so that erasure of an erase block amounts to erasure of a large portion of array 16 at a single time.

The individual cells of array 16 of FIG. 1 are addressed by address bits A(21:0) and AX, with the three highest order address bits (A21, A20, and A19) determining the main block, the three next highest order address bits (A18, A17, and A16) determining the erase block, the next address bit (Al5) determining the cylinder, the next six address bits (A14:9) determining the sector, the next four address bits (A8:5) and address bit AX determining the packet (within the sector), and the five lowest order address bits (A4:0) determining the byte within the packet. Address bits A(21:9) are used by X decoder 12 to select the row (sector) of array 16 in which the target byte is located and the remaining nine address bits A(8:0) and address bit AX are used by Y decoder circuit 13A to select the appropriate columns of array 16 in which the target byte is located. Additional address bit AX is used for selecting a packet consisting of overhead bits (such as ECC check bits and redundancy bits). More specifically, seventeen packets are stored per sector, including sixteen packets of ordinary data (any one of which can be selected by address bits A(8:5)) and one packet of overhead bits (which can be selected by address bit AX).

In a normal operating mode, system 3 executes a write operation as follows. Interface 4 asserts appropriate ones of address bits A(21:0) and AX to decoder circuits 12 and 13A. In response to these address bits, circuit 12 determines a row address which selects one sector (row) of cells and circuit 13A determines a column address (which selects eight of the columns of memory cells of array 16). The row and column address thus together select a total of eight target cells in one selected row (for storing one byte of data). In response to a write command supplied from controller 29, a signal (indicative of an eight-bit byte of data) present at the output of input buffer 11 is asserted through the relevant Y multiplexer circuitry (e.g., through circuit YMuxH, where the data is to be written to target cells in block 16H) to the eight target cells of array 16 determined by the row and column address (e.g., to the drain of each such cell). Depending on the value of each of the eight data bits, the corresponding target cell is either programmed or it remains in an erased state.

In the normal operating mode, system 3 executes a read operation as follows. Interface 4 asserts appropriate ones of address bits A(21:0) and AX to circuits 12 and 13A. In response to these address bits, circuit 12 determines a row address which selects one row (sector) of cells, and circuit 13A determines a column address (which selects eight of the columns of memory cells of array 16). The row and column address thus together select a total of eight target cells in one selected row (for storing one byte of data). In response to a read command supplied from control unit 29, a current signal (a "data signal") indicative of a data value stored in one of the eight target cells of array 16 is supplied from the drain of each of the target cells through the bitline of the target cell and then through the relevant Y multiplexer circuitry (e.g., through circuit YMuxH, where the data is stored in cells within block 16H) to sense amplifier circuitry 33. Each data signal is processed in sense amplifier circuitry 33, buffered in output buffer 10, and finally asserted through host interface 4 to an external device.

System 3 also includes a pad (not shown) which receives a high voltage $V_{pp}$ from an external device, and a switch connected to this pad. During some steps of a typical erase or program sequence (in which cells of array 16 are erased or programmed), control unit 29 sends a control signal to the switch to cause the switch to close and thereby assert the high voltage $V_{pp}$ to various components of the system including wordline drivers within X decoder 12 (or the source line within array circuit 16.

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffer 10.

It is important during a write operation to provide the wordline of each selected cell with the proper voltage and the drain of each selected cell with the appropriate voltage level (the voltage determined by the output of input buffer 11), in order to successfully write data to the cell without damaging the cell.

Controller 29 of system 3 controls detailed operations of system 3 such as the various individual steps necessary for carrying out programming, reading, and erasing operations. Controller 29 thus functions to reduce the overhead required of the external processor (not depicted) typically used in association with system 3.

A conventional memory system having an array of cells connected along bitlines and wordlines (e.g., a flash memory system of the type described above) has the following limitation. When one of the wordlines is selected by address bits A(21:9), the wordline driver for the selected wordline charges the wordline (by asserting a voltage to one end of the wordline). The operation of charging up the selected wordline is inherently time consuming, and (for a typical wordline) a significant amount of time is needed to charge the entire wordline. An amount of time determined by the RC (resistance and capacitance) characteristic of the wordline is inherently required. Thus, where the wordline driver is at the opposite side of the array from a selected packet to be read, a significant amount of time must elapse before that packet can be read. Where the array's wordlines are very long (e.g., where the array is designed with very long rows of cells to emulate a magnetic disk device) and the array does not include metal strapping, the wait time needed to charge the selected wordline is an especially large (and significant) portion of the overall access time for reading the selected packet. For example, where the "first" packet (whose cells are connected along bitlines BL0, BL1, etc. near the left side of array 16) is selected, and the wordline driver for the selected wordline is one of the drivers in set 12B and is thus positioned at the right side of array 16, a significant amount of time must elapse before the any of the cells in the first packet can be read. In the example set forth in the previous sentence, cells in the "last" packet of the selected wordline (the cells of the wordline which are connected along bitlines BLN, BLN-1, etc. near the right side of array 16) could be read with much less delay, since the gates of the cells in the last packet would be charged much sooner than the gates of the cells in the first packet.

It would be desirable to improve existing technology to overcome the above-described limitation, and thereby enable data (stored in selected cells of each sector) to be read more rapidly than could be read using existing technology.

SUMMARY OF THE INVENTION

The memory system of the invention includes an array of memory cells (e.g., flash memory cells) connected along wordlines and bitlines, two physically separated sets of wordline drivers (each for driving a different subset of the wordlines), and circuitry which writes data to selected cells connected along a selected wordline of the array, where the cells are selected to reduce the time needed to read the data from the cells (after the data has been written thereto).

In preferred embodiments, an unmodified set of bitline addresses is associated with each set of data to be written to a row of cells (connected along one of the wordlines). In accordance with the invention, a modified (scrambled) set of bitline addresses is generated for at least one such set of data to reduce the time needed to read a subset of the set from cells of a row (after the set has been written to the row), and the unmodified set of bitline addresses is generated for at least one other such set of data (and used to write such other set to another row). By writing a set of data to a row in accordance with the scrambled bitline addresses, a subset of the set (a subset intended to be rapidly readable) is written to cells of the row which are nearest to the wordline driver for the row.

In preferred embodiments, in order to write a sector of data consisting of packets of the data to cells connected along a selected wordline, the system writes the first packet (or the first N bits of the first packet, where N is an integer) of the data to the cells which are physically nearest to the wordline driver which drives the selected wordline. Such embodiments are particularly useful to reduce the time needed to perform header search operations along the sectors, in which only the first few bytes within the first packet are read (or the entire first packet of each sector is read). In some such preferred embodiments, one set of wordline drivers (positioned along one side of the array nearest to a first bitline) drives the even-numbered wordlines, another set of wordline drivers (positioned along the opposite side of the array nearest to a last bitline) drives the odd-numbered wordlines, and the system exchanges the bitline addresses of the first packet and last packet (or the first few bytes of the first packet and the last few bytes of the last packet) of each sector of data to be written to cells connected along an even-numbered wordline (or inverts the bitline addresses for the entire sector, thus reversing the order, from left-to-right to right-to-left, in which all the bits of the sector are written), but the system does not modify the bitline address of any of the bits of a sector of data to be written to cells connected along an odd-numbered wordline.

Preferably, the memory cells of the inventive system are flash memory cells. Also preferably, the inventive system is implemented as a single integrated memory circuit (memory chip).

Some embodiments of the invention are operable in two modes: a first mode in which it modifies the address (or addresses) to which selected data is to be written to an array of cells (to reduce the time needed to read the data after it has been written); and a second mode in which it does not modify the address (or addresses) to which selected data is to be written to the array.

Other embodiments of the invention are methods and apparatus which write data to selected cells connected along a selected wordline of an array of memory cells connected along wordlines and bitlines, where two physically separated sets of wordline drivers drive different subsets of the wordlines, and where the cells to which the data are written are selected to reduce the time needed to read the data from the cells. In preferred embodiments, the data written (so as to be rapidly readable) are the first few bytes of a sector (or other data bit set), which are read very rapidly during a subsequent header search operation or other read operation in which only the first few bytes of each of several sectors (or other data sets) stored in the array are read. The cells (connected along each selected one of the wordlines) to which the data are written (so as to be rapidly readable) are those nearest to the wordline driver which drives the selected one of the wordlines.

DETAILED DESCRIPTION OF THE PREFERRED EMBODIMENTS

Figure 1:
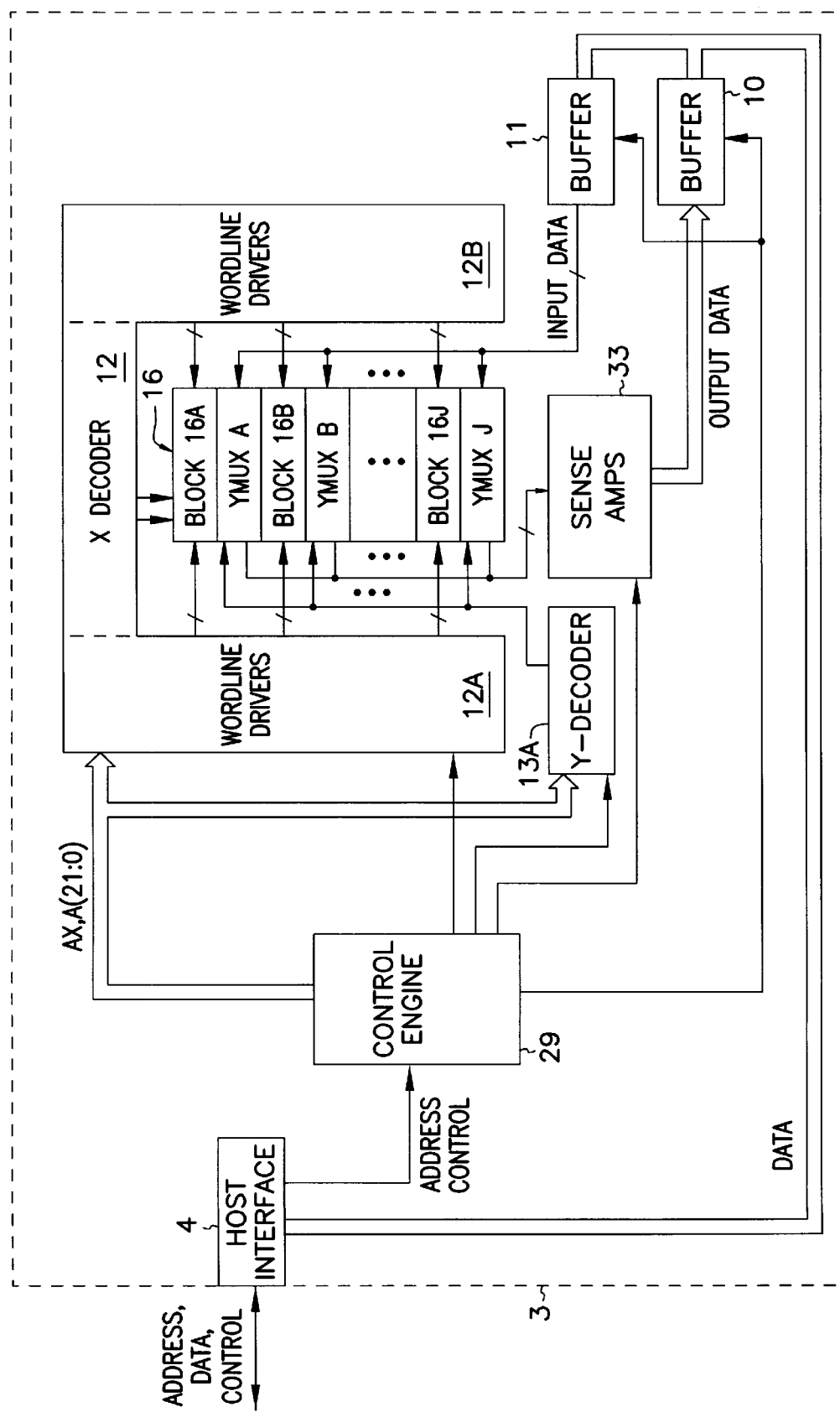
FIG. 1 is block diagram of a conventional nonvolatile (flash) memory circuit (implemented as an integrated circuit), including a conventional controller for controlling memory operations of the circuit.
Figure 2:
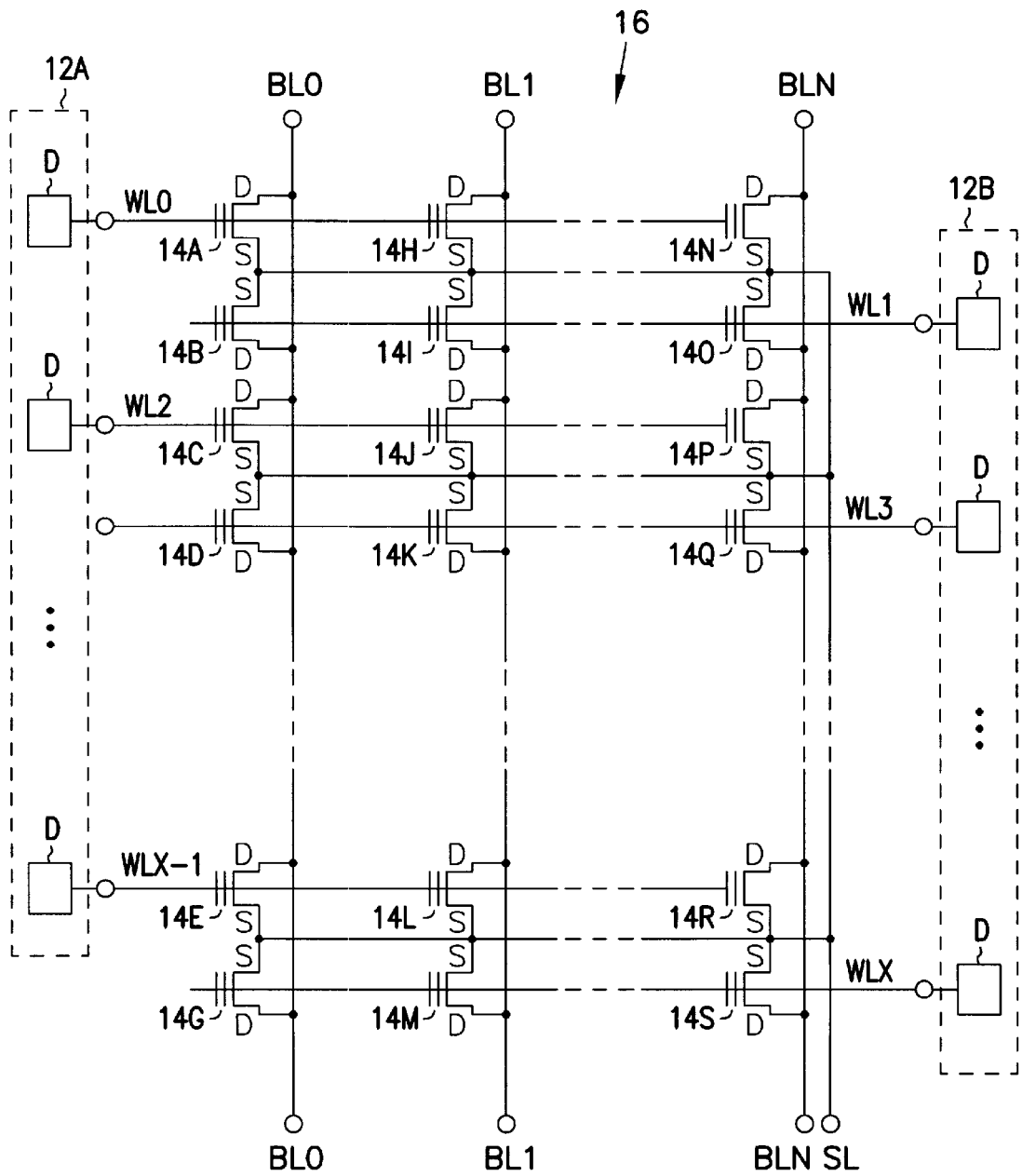
FIG. 2 is a simplified schematic diagram of a conventional flash memory array, and a block diagram of wordline driver circuitry for driving the wordlines of the array.

Preferred embodiments of the invention will be described with reference to FIGS. 3, 4, 5, and 6. One such embodiment is flash memory system 30 shown in FIG. 4 which includes array 16 of flash memory cells. Memory system 30 of FIG. 4 can be identical to system 3 of FIG. 1, except in that system 30 includes controller 129 which is designed and programmed in accordance with the invention (rather than controller 29 of FIG. 1), and in that system 30 includes address bit inverter circuit 110 and register 112. Those elements of system 30 of FIG. 4 that are identical to corresponding elements of system 3 of FIG. 1 are identically numbered in FIGS. 1 and 4, and the description thereof will not be repeated below. Although system 30 can be implemented as a single integrated circuit, it is not necessarily implemented as a single integrated circuit, and the following description of system 30 will not assume that it is an integrated circuit.

Figure 3:
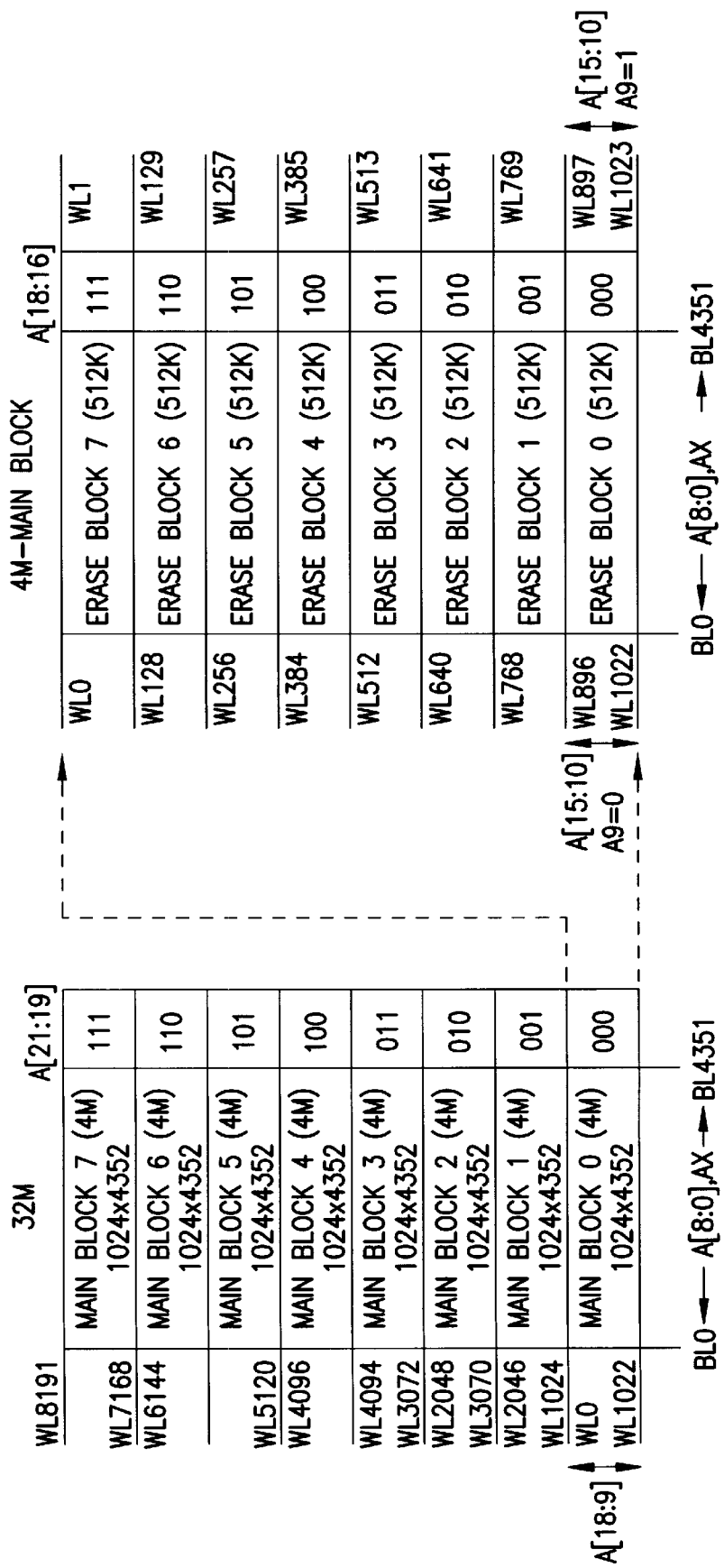
FIG. 3 is a diagram of the manner in which cells of a flash memory array are organized in a flash memory system which emulates a magnetic disk drive system, and which embodies the invention.

In one preferred implementation, array 16 of system 30 has capacity to store 32 Megabits of ordinary data (plus 2 Megabits of overhead data). FIG. 3 is a diagram of the manner in which the cells of such an implementation of array 16 are organized.

In the FIG. 3 implementation, array 16 has 544 bytes per row of flash memory cells. Each byte consists of eight bits, and each memory cell is capable of storing one bit. Each row of cells is equivalent to a magnetic disk "sector" (512 bytes of data plus 32 bytes of "overhead"). Thus, array 16 is designed with very long rows of cells (in order to emulate a magnetic disk device), and the array's wordlines are therefore very long. Thus, the wait time needed to charge a selected wordline entirely is significant, and this wait time is a significant portion of the overall access time for reading the packet (of the selected wordline) which is farthest from the wordline driver.

It is also desirable to design a memory array with very long rows of cells since it is typically inexpensive to manufacture an array having such a design.

The array is partitioned into eight "main" blocks of cells. The main blocks are decode blocks (of the type mentioned above) and are physically isolated from one another.

Each main block consists of 1024 rows of cells. Each row consists of 4352 cells connected along a common wordline. Each of the cells in a row is connected along a different bitline. The wordlines of the main block shown on the right side of FIG. 3 (which is the main block shown at the bottom of the left side of FIG. 3) are numbered WL0 through WL1023, and the bitlines are numbered BL0 through BL4351. Each row is capable of storing seventeen "packets" of bits, each packet consisting of 32 eight-bit bytes. Thus, each row (capable of storing 544 bytes) corresponds to one conventional magnetic disk sector (comprising 544 bytes). Each row can store 512 bytes of data of interest as well as 32 ECC bytes for use in error detection and correction (or 32 "overhead" bytes of some type other than ECC bytes, or a combination of ECC bytes and other overhead bytes).

The even-numbered wordlines (WL0, WL2, . . . , WL8188, and WL8190) are driven by wordline drivers (within set 12A) positioned on the left side of array 16, and the odd-numbered wordlines (WL1, WL3, WL8189, and WL8191) are driven by wordline drivers (within set 12B) positioned on the right side of array 16.

Each main block is subdivided into eight independently erasable "erase blocks." Each erase block consists of 128 of the described rows of flash memory cells, and thus has capacity to store 128×4352 bits. Each erase block is divided into two blocks of cells known as "cylinders" of cells, each cylinder having capacity to store 278,528 bits of data organized into 64 sectors (i.e. 64 rows).

The individual cells of the FIG. 3 implementation of array 16 are addressed by address bits A(21:0) and AX, with the three highest order address bits (A21, A20, and A19) determining the main block. As indicated in FIG. 3, the main block at the top of the left side of FIG. 3 is selected when A21=1, A20=1, and A19=1, and the main-block at the bottom of the left side of FIG. 3 is selected when A21=0, A20=0, and A19=0.

The three next highest order address bits (A18, A17, and A16) determine the erase block. As indicated in FIG. 3, the erase block at the top of the right side of FIG. 3 is selected when A18=1, A17=1, and A16=1, and the erase block at the bottom of the right side of FIG. 3 is selected when A18=0, A17=0, and A16=0.

The next most significant address bit (A15) determines the cylinder, and the next six most significant address bits A(14:9) determine the sector (i.e., a row within the selected cylinder). Thus, in response to address bits A(21:9), X decoder 12 selects a row of array 16 in which a target byte is located (by causing the wordline driver of the selected row to assert an appropriate voltage to the wordline along which the selected row of cells is connected, to charge that wordline). If the selected wordline is an even-numbered wordline, the corresponding wordline driver (connected to the left end of the wordline) charges up the wordline from left to right. If the selected wordline is an odd-numbered wordline, the corresponding wordline driver (connected to the right end of the wordline) charges up the wordline from right to left.

The next four most significant address bits A(8:5) and additional address bit AX (as described above) determine the packet of the target byte (i.e., these address bits determine the packet of cells in the selected row to which the target byte should be written or from which the target byte should be read). The five least significant (lowest order) address bits A(4:0) determine which byte within the selected packet is the target byte. Thus, in response to address bits A(8:0) and AX, Y decoder 13A selects the eight columns of array 16 in which the target byte is located (and thus the eight bitlines along which the target byte cells are connected).

Figure 4:
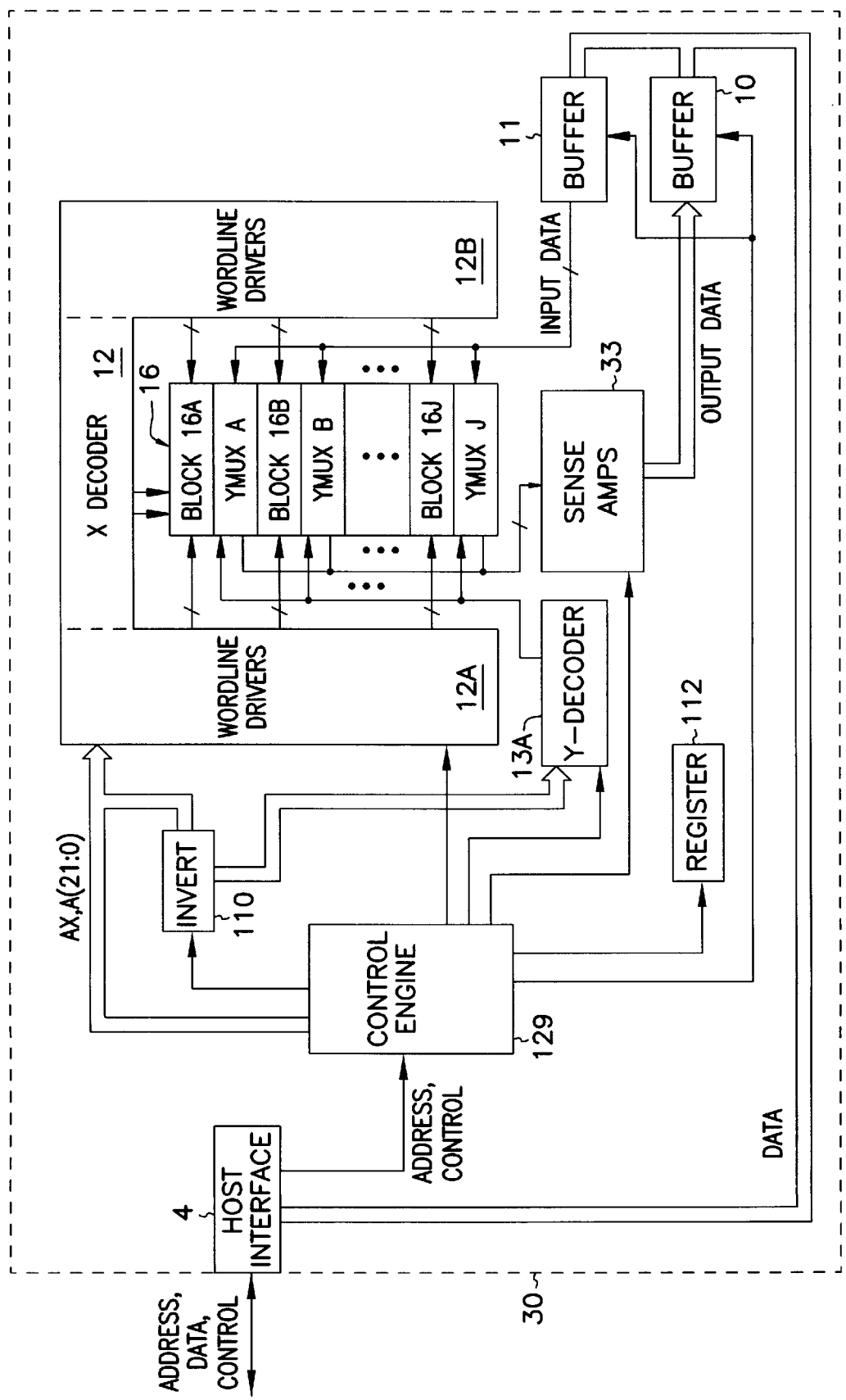
FIG. 4 is block diagram of a nonvolatile (flash) memory circuit (implemented as a system or an integrated circuit), which embodies the invention.

When writing an eight-bit byte of data to cells along a selected wordline of array 16 of FIG. 4, the bits of the byte are typically written simultaneously (in parallel) but not to adjacent cells along the wordline. This is because adjacent cells are typically in close physical proximity to each other, so that the operation of writing one of the bits to a cell could electrically interfere with the operation of writing another bit to an adjacent cell. Instead, it is typical for the byte to be written to cells spread out across an entire row, for example, with the bits of an eight-bit byte written to columns spaced approximately 544 columns apart from each other where the row consists of 4352 cells (since 4352/8=544). If a byte is written in accordance with this typical technique, it is necessary to wait for the entire wordline to be charged to read the byte.

Figure 6:
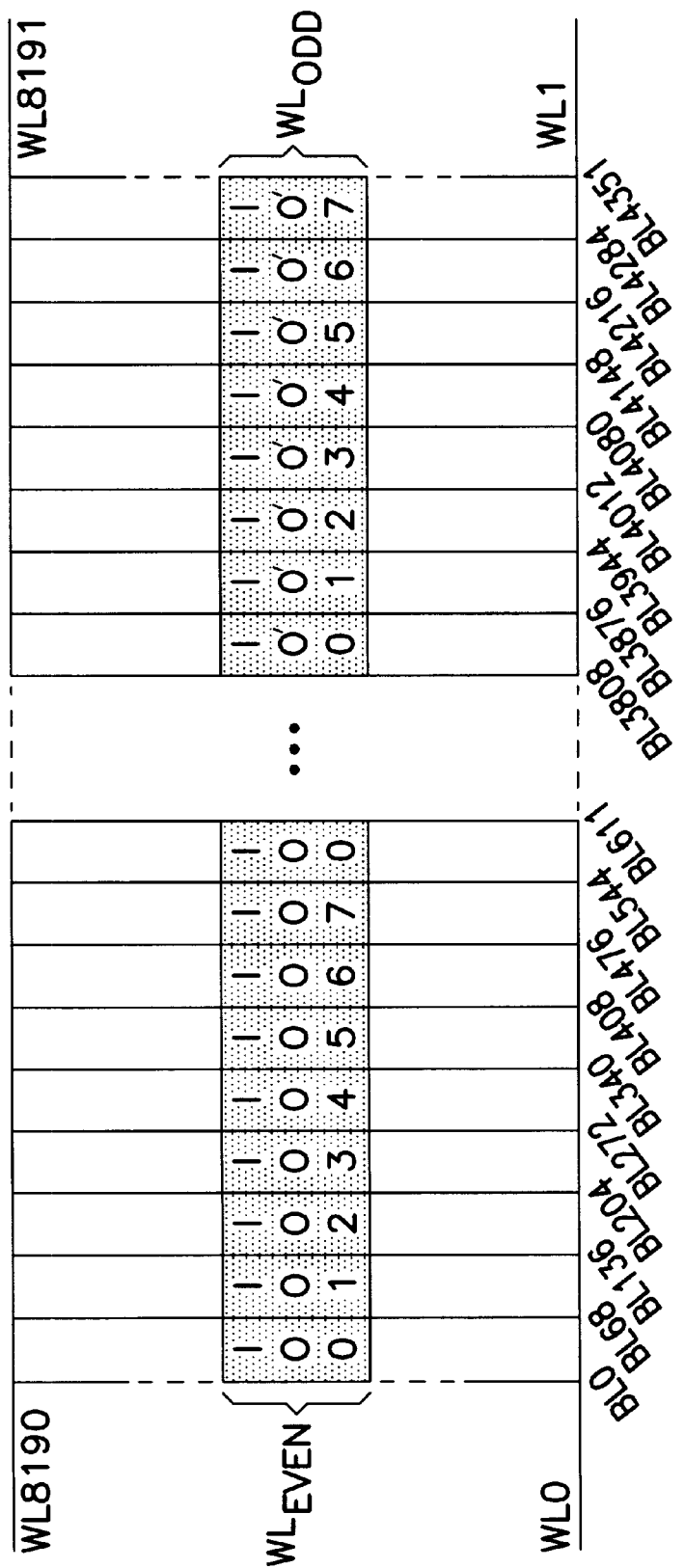
FIG. 6 is a diagram representing the manner in which the bits of each 8-bit byte are written to flash memory cells of a flash memory system in a preferred embodiment of the invention.

In a preferred embodiment of the invention, to avoid programming adjacent cells simultaneously but still achieve an access time improvement (in accordance with the invention), the cells to which the bits of each byte are written are spaced 68 columns apart from each other. FIG. 6 illustrates this preferred technique. FIG. 6 represents an implementation of flash memory array 16 comprising 8192 wordlines and 4352 bitlines, where the even-numbered wordlines are driven by wordline drivers on the left edge of FIG. 6, and the odd-numbered wordlines are driven by wordline drivers on the left edge of FIG. 6. To write a first byte (consisting of eight bits IO0 through IO7) to a row connected along an even-numbered wordline (e.g., wordline "$WL_{even}$" in FIG. 6), the first bit (bit IO0) is written to a cell connected along one of bitlines BL0 through BL67, the second bit (bit IO1) is simultaneously written to a cell connected along one of bitlines BL68 through BL135), the third bit (bit IO2) is written to a cell connected along one of bitlines BL136 through BL203, and so on. To write a first byte (consisting of eight bits IO'0 through IO'7) to a row connected along an odd-numbered wordline (e.g., wordline "$WL_{odd}$" in FIG. 6), the first bit (bit IO'0) is written to a cell connected along one of bitlines BL4285 through BL4351, the second bit (bit IO'1) is simultaneously written to a cell connected along one of bitlines BL4217 through BL4284), the third bit (bit IO'2) is written to a cell connected along one of bitlines BL4149 through BL4216, and so on. In this preferred embodiment, only about one-eighth of a wordline has to be charged to its read level to read the first byte stored along each wordline, regardless of whether the wordline is odd-numbered or even-numbered. When the FIG. 4 embodiment of the inventive system implements this method, control engine 29 generates address bits AX and A(21:0) for each such byte, and inverter 110 inverts the appropriate bits of the address for each byte to be written to an odd-numbered wordline.

In variations on the preferred embodiment described with reference to FIG. 6, each row consists of X cells, where X is an integer much greater than eight, and the bits of each byte are written to cells separated by Y of the cells, where Y is an integer greater than two but much less than X. The integer X need not equal 4352, and the integer Y need not equal 68, as in the FIG. 6 embodiment. Y and X should be chosen to avoid programming adjacent cells (or cells undesirably close together) simultaneously but still achieve an access time improvement (in accordance with the invention).

Circuits 12, 13A, 33, and the described Y Multiplexer circuitry (including the YMuxA, YMuxB, and YMuxH circuitry) are sometimes referred to herein collectively as "array interface circuitry."

Controller 129 generates a set of address bits A(21:0) and AX for each byte to be written to or read from array 16, in response to a buffered external address (and a control signal indicating a read or write operation) from host interface 4. The buffered external address and control signal are asserted by host interface 4 in response to an external address and at least one external control signal from an external device. In addition to generating a set of address bits A(21:0) for each byte of data, controller 129 preferably also generates (and asserts to circuit 13A) additional bit AX, whose function has been described above.

When one of the wordlines of array 16 is selected by address bits A(21:9), the wordline driver for the selected wordline charges the wordline by asserting a voltage to one end of the wordline. The operation of charging up the selected wordline is time consuming, and a significant amount of time (typically requiring about 2 microseconds) is needed to charge the entire wordline. As discussed above, to charge an entire wordline, an amount of time determined by the RC (resistance and capacitance) characteristic of the wordline is inherently required.

For convenience, we will use the following terminology below: each row of cells of array 16 which is driven by a wordline driver positioned on the left side of array 16 is a row of the "first type"; each row of cells of array 16 which is driven by a wordline driver positioned on the right side of array 16 is a row of the "second type"; each sector of data to be written to a row of the first type is a sector of the "first type"; and each sector of data to be written to a row of the second type is a sector of the "second type."

System 30 can operate in a mode in which data is to be written to array 16, and control engine 129 enables inverter 110 (by sending an appropriate control signal thereto) thereby causing inverter 110 to operate in a mode as follows: inverter 110 inverts bits A(8:0) of each address bit set A(21:0) that inverter 110 receives from controller 129 for each sector of the second type; and inverter 110 does not invert bits A(8:0) of each address bit set A(21:0) that inverter 110 receives from controller 129 for each sector of the first type.

In a variation on the embodiment described in the preceding paragraph, inverter 110 (after being enabled) inverts the bits A(8:0) of the sets A(21:0) for only the first and last packets of each sector of the second type; and inverter 110 does not invert bits A(8:0) of each address bit set A(21:0) that inverter 110 receives from controller 129 for each sector of the first type. As a result, the first packet of each sector of the second type will be written at the right side of the corresponding row (adjacent to the wordline driver for the row), the last packet of each such sector will be written at the left side of the row, and the second packet of each such sector will be written immediately to the right of the last packet.

In another variation on the embodiments described in the two preceding paragraphs, inverter 110 inverts the bits A(8:0) of the sets A(21:0) for only the first M bytes of the first packet and the last M bytes (where M is any integer greater than or equal to one) of the last packet of each sector of the second type; and inverter 110 does not invert bits A(8:0) of each address bit set A(21:0) that inverter 110 receives from controller 129 for each sector of the first type. As a result, only the first M bytes of the first packet of each sector of the second type will be written at the right side of the corresponding row (adjacent to the wordline driver for the row), the last M bytes of the last packet of each such sector will be written at the left side of the row, and the remaining bytes of the first packet of each such sector will be written immediately to the right of the last M bytes of the last packet.

In any of the described embodiments, inverter 110 preferably is controlled by address bit A9 (which inverter 110 receives from controller 129 as a member of each set of address bits A(21:0) and AX), in the following sense: inverter 110 inverts appropriate bits (e.g., bits A(8:0), in the preferred embodiment) of the current set of address bits, in response to address bit A9 (of the current set) having the logical value "1"; and inverter 110 does not invert any bits A(8:0) of the current set of address bits, in response to address bit A9 (of the current set) having the logical value "0". Address bit A9 can be used in this manner as a control signal since, when controller 129 asserts a set of address bits A(21:0) which includes address bit A9 having the logical value "1", the wordline driver of the row of cells selected by bits A(21:9) is on the right side of array 16 (and thus inverter 110 should invert bits of the current set of address bits in response to bit A9 having the value "1"). Similarly, when controller 129 asserts a set of address bits A(21:0).which includes address bit A9 having the logical value "0", the wordline driver of the row of cells selected by bits A(21:9) is on the left side of array 16 (and thus inverter 110 should not invert bits of the current set of address bits).

Figure 5:
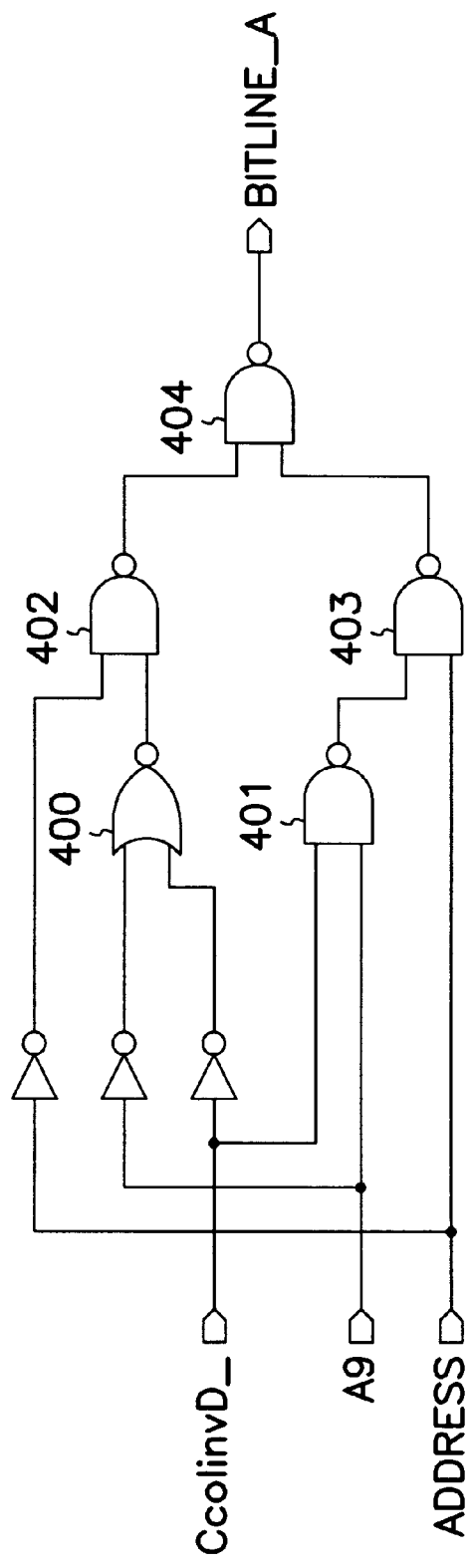
FIG. 5 is schematic diagram of a preferred implementation of a portion of circuit 110 of FIG. 4.

FIG. 5 is schematic diagram of a preferred implementation of a portion of circuit 110 of FIG. 4. In FIG. 5, "address" is one of the address bits A(8:0) and AX which determine bitline address, and "CcolinvD_" denotes a control signal received by the FIG. 5 circuit from controller 129. It is contemplated that circuit 110 would consist of ten of the FIG. 5 circuits connected in parallel (each for receiving a different "address" bit). As explained above, address bit A9 determines whether the wordline driver for the selected row is on the right or left side of the row. Address bit A9 is supplied to one input of NAND gate 401 (of each of the FIG. 5 circuits within circuit 110), and its inverse is supplied to one input of NOR gate 400 (of each of the FIG. 5 circuits within circuit 110). The other input of gate 401 (of each of the FIG. 5 circuits within circuit 110) receives control signal CcolinvD_1 and the other input of gate 400 (of each of the FIG. 5 circuits within circuit 110) receives the inverse of control signal CcolinvD_. One input of NAND gate 402 receives the output of gate 400 and the other input of gate 402 receives the inverse of "address," and one input of NAND gate 403 receives the output of gate 401 and the other input of gate 403 receives "address." One input of NAND gate 404 receives the output of gate 402 and the other input of gate 404 receives the output of gate 403. The output of NAND gate 404 (signal Bitline_A) is identical to the input bit ("address") when control signal CcolinvD_ is low (disabling the address inversion function of circuit 110), and the output of NAND gate 404 (signal Bitline_A) is either the inverse of "address" or identical to "address" when control signal CcolinvD_ is high (depending on the value of bit A9. More specifically, when CcolinvD_ and A9 are both high, the output of NAND gate 404 is the inverse of "address," and when CcolinvD_ is high but A9 is low the output of NAND gate 404 is identical to "address."

System 30 can operate in a mode in which it reads data from array 16, and control engine 129 enables inverter 110 (by sending an appropriate control signal thereto) thereby causing inverter 110 to operate in a mode as follows: inverter 110 inverts bits A(8:0) of each address bit set A(21:0) that inverter 110 receives from controller 129 for each sector of the second type; and inverter 110 does not invert bits A(8:0) of each address bit set A(21:0) that inverter 110 receives from controller 129 for each sector of the first type. As a result, each target byte to be read from the first packet of a sector of the second type is read from cells of the packet at the right side of the corresponding row (i.e., from cells adjacent to the wordline driver which drives that row), each target byte to be read from the second packet of such sector is read from the packet immediately to the left of the packet on the right side of the row, and so on (so that each target byte to be read from the last packet of such sector is read from the packet on the left side of the row).

In a variation on the read mode described in the preceding paragraph, inverter 110 (after being enabled) inverts the bits A(8:0) of the sets A(21:0) for only the first and last packets of each sector of the second type; and inverter 110 does not invert bits A(8:0) of each address bit set A(21:0) that inverter 110 receives from controller 129 for each sector of the first type. As a result, the first packet of each sector of the second type will be read from the right side of the corresponding row (adjacent to the wordline driver for the row), the last packet of each such sector will be read from the left side of the row, and the second packet of each such sector will be read from the packet immediately to the right of the packet on the left side of the row.

In another variation on the read mode described in the two preceding paragraphs, inverter 110 inverts the bits A(8:0) of the sets A(21:0) for only the first M bytes of the first packet and the last M bytes (where M is any integer greater than or equal to one) of the last packet of each sector of the second type; and inverter 110 does not invert bits A(8:0) of each address bit set A(21:0) that inverter 110 receives from controller 129 for each sector of the first type. As a result, only the first M bytes of the first packet of each sector of the second type will be read from the right side of the corresponding row (adjacent to the wordline driver for the row), the last M bytes of the last packet of each such sector will be read from the left side of the row, and the remaining bytes of the first packet of each such sector will be read from cells immediately to the right of those cells from which the last M bytes of the last packet are read.

An example of a read mode as described in any of the three previous paragraphs is a "scan mode" (or "header search mode") in which only the first few bytes of each sector stored in array 16 are to be read (to identify those of the sectors having a particular header). The invention enables such a scan mode (or header search mode) to be implemented significantly more rapidly than if the first few bytes of the first packet of each sector were read from the left side of array 16 (assuming the data have been written to array 16 in accordance with the invention, using an enabled inverter 110).

System 30 is preferably also operable in a mode in which inverter 110 is disabled. In such a mode, controller 129 sends an appropriate control signal to inverter 110 to disable inverter 110. The disabled inverter 110 does not invert any bits of any of the address bit sets A(21:0) and AX that it receives from controller 129. Instead, the disabled inverter 110 passes through, without altering, each such address bit set. An example of such a mode is a test mode of operation of system 30, when system 30 (e.g., array 16 of system 30) is undergoing a test and system 30 is neither executing a normal read operation (in which data of interest is read from array 16) nor a normal write operation (in which data of interest is written to array 16).

Register 112 is provided to store an overhead bit which it receives from controller 129 and which indicates whether or not the addresses of data stored in a given row were scrambled in accordance with the invention (by being written using address bits output from inverter 110 operating in an enabled state). At an appropriate time during execution of a read operation, controller 129 reads the overhead bit corresponding to each row of data to be read from array 16 from register 112, and generates a control signal for inverter 110 depending on the value of each overhead bit. For example, controller 129 generates a control signal for disabling inverter 110 if the overhead bit indicates that the addresses of the data to be read from array 16 have not been scrambled (so that inverter 110 is disabled during the operation of reading such data), or controller 129 generates a control signal for enabling inverter 110 if the overhead bit indicates that the addresses of the data to be read from array 16 have been scrambled (so that inverter 110 is enabled during the operation of reading such data).

Other aspects of the invention are methods (which can be implemented by the above-described memory systems) for writing data to an array of memory cells and optionally also reading the so-written data.

One such method is for writing data to an array of memory cells connected along wordlines and bitlines, where a first subset of the wordlines are driven by wordline drivers positioned along one side of the array (the cells connected along each wordline in the first subset are referred to as a cell row "of a first type"), and a second subset of the wordlines are driven by wordline drivers positioned along another side of the array (the cells connected along each wordline in the second subset are referred to as a cell row "of a second type"), said method including the steps of:

(a) generating scrambled bitline addresses for a set of the data to be written to a cell row of the second type;

(b) writing the set to the cell row of the second type using the scrambled bitline addresses, wherein the scrambled bitline addresses are such that less time is needed to read a subset of the set from said cell row of the second type than would be required to read said subset if the set were written to that row using unmodified bitline addresses; and (c) writing a second set of data to a row of the first type using the unmodified bitline addresses.

In a class of preferred implementations, the scrambled bitline addresses include inverted bitline addresses for at least a subset of the set of the data, and each of the inverted bitline addresses is inverted relative to a corresponding one of the unmodified bitline addresses. In one such implementation, step (a) includes the step of generating the inverted bitline addresses for all bits of the set of the data. In another such implementation, the set of data is a sector of the data, the sector comprises packets of the data, and step (a) includes the step of generating the inverted bitline addresses for only a first one of the packets of the sector and a last one of the packets of the sector. In yet another implementation, step (a) includes the step of generating the inverted bitline addresses for only the first M bytes of a first one of the packets of the sector, and the last M bytes of a last one of the packets of the sector, where M is an integer not less than one.

Preferably, steps (a) and (b) are repeated several times, each time to generate inverted bitline addresses for a different set of data to be written to a different cell row of the second type, and to write at least a subset of each set of data to cells of the array determined by the inverted bitline addresses for each such set of data. Also preferably, step (c) is repeated several times, each time to write a different set of data (e.g., a set of data different from any set written in any previous repetition of step (b) or (c)) to a different cell row of the first type using noninverted bitline addresses for each such set of data.

Also preferably, the described method also includes the steps of:

(d) using the scrambled bitline-addresses, reading the subset of the set of the data from cells of the array determined by said scrambled bitline addresses; and (e) reading the second set of data from the row of the first type using the unmodified bitline addresses.

In a preferred embodiment in which the set of data is a sector of the data, and the sector comprises packets of the data, step (d) preferably includes the step of reading only a first one of the packets of the sector and a last one of the packets of the sector. Alternatively, step (d) includes the step of reading only the first M bytes of a first one of the packets of the sector, and the last M bytes of a last one of the packets of the sector, where M is an integer not less than one.

In other embodiments, the invention is a method for writing sets of data to an array of memory cells connected along wordlines and bitlines, where a first subset of the wordlines are driven by wordline drivers positioned along one side of the array (the cells connected along each wordline in the first subset are referred to as a cell row "of a first type"), and a second subset of the wordlines are driven by wordline drivers positioned along another side of the array (the cells connected along each wordline in the second subset are referred to as a cell row "of a second type"), said method including the steps of:

(a) inverting bitline addresses of at least a subset of each set of data to be written to a cell row of the second type, thereby generating inverted bitline addresses;

(b) writing each said subset of each set of data to cells of the array using the inverted bitline addresses; and (c) writing at least one set of data to a cell row of the first type without inverting any bitline address of said at least one set of data.

In another class of embodiments, the invention is a method for writing data to an array of cells, wherein rows of the cells are connected along wordlines and columns of the cells are connected along bitlines, each of at least two physically separated sets of wordline drivers drives a different subset of the wordlines, and a different one of the wordline drivers drives each of the wordlines, said method including the steps of:

(a) receiving a sequence of data sets, each of the data sets including X bits received as a sequence of Y-bit subsets, wherein the Zth one of the subsets comprises header data, where X, Y, and Z are integers, and Y is less than X; and (b) writing each of the data sets to a different one of the rows, such that for each of the data sets written to one of the rows, the Zth one of the subsets is written to cells of said one of the rows that are nearest to the wordline driver for said one of the rows.

In preferred embodiments, each of the data sets is a sector of data, each of the subsets is a packet of data, and the Zth one of each of the subsets is the first packet of said each of the subsets.

Preferred embodiments of the invention have been described with reference to FIGS. 3, 4, 5, and 6. Although these embodiments have been described in some detail, it is contemplated that changes from these embodiments can be made without departing from the spirit and scope of the invention as defined by the appended claims.

What is claimed is:

1. A memory comprising:

an array of memory cells connected to wordlines;

first wordline drivers located at a first end of the wordlines to drive a first subset of the wordlines;

second wordline drivers located at an opposite second end of the wordlines to which drive a second subset of the wordlines; and address circuitry for accessing memory cells, the address circuitry modifies externally provided memory cell addresses to reduce a physically distance between a selected memory cell and a wordline.

2. The memory of claim 1 wherein each of the memory cells is a flash memory cell.

3. A flash memory device comprising:

memory cells having a control gate coupled to a wordline;

a wordline driver located along the wordline;

address circuitry for receiving externally provided memory cell addresses for accessing memory cells located along the wordline; and address modification circuitry for modifying the externally provided memory cell addresses to access memory cells located along the wordline which are located physically closer to the wordline driver than memory cells identified by the externally provided memory cell addresses.

4. The flash memory device of claim 3 wherein the flash memory device receives a plurality externally provided memory cell addresses and the address modification circuitry modifies a subset of the plurality externally provided memory cell addresses.

5. The flash memory device of claim 4 wherein the flash memory device receives externally provided memory cell addresses for N-bytes memory cells for storing header data and M-bytes memory cells for storing non-header data, and the address modification circuitry modifies the memory cell addresses for N-bytes memory cells.

6. The flash memory device of claim 3 wherein the address modification circuitry inverts the externally provided memory cell addresses.

7. The flash memory device of claim 3 wherein the wordline driver located at a first end of the wordline.

8. A flash memory device comprising:

memory cells having a control gate coupled to a wordline;

a wordline driver located along the wordline;

address circuitry for receiving externally provided memory cell addresses for accessing memory cells located along the wordline; and means for performing the function of modifying the externally provided memory cell addresses to access memory cells located along the wordline which are located physically closer to the wordline driver than memory cells identified by the externally provided memory cell addresses.

9. A memory system comprising:

a processor; and a flash memory coupled to the processor, and comprising:

memory cells having a control gate coupled to a wordline;

a wordline driver located along the wordline;

address circuitry for receiving memory cell addresses provided by the processor for accessing memory cells located along the wordline; and address modification circuitry for modifying the externally provided memory cell addresses to access memory cells located along the wordline which are located physically closer to the wordline driver than memory cells identified by the externally provided memory cell addresses.

10. The memory system of claim 9 wherein the flash memory comprises a plurality of wordlines and a plurality of wordline drivers, some of the wordline driver are located at a first end of the wordlines and other wordline drivers are located at an opposite end of the wordlines.

11. A method of accessing memory cells in a memory device, the method comprising:

receiving at least one externally provided memory cell address to access a memory cell located at a first location along a wordline; and modifying the externally provided memory cell address to access a memory cell located at a second location along the wordline, wherein the second location is physically closer to a wordline driver coupled to the wordline.

12. The method of claim 11 wherein the externally provided memory cell address is modified by inverting the address.

13. The method of claim 11 wherein the at least one externally provided memory cell address comprises a plurality of addresses identifying a plurality of bytes of memory cells.

14. The method of claim 13 wherein a subset of the plurality of addresses are modified to change a location of some of the plurality of bytes of memory cells.

15. The method of claim 14 wherein memory cells located at the subset of the plurality of addresses are intended to store header data.

16. A method for writing data to memory cells connected along wordlines, wherein first wordlines are driven by a first set of wordline drivers positioned at one end of the first wordlines, second wordlines are driven by a second set of wordline drivers positioned at an opposite end of the odd-numbered wordlines, the method comprises:

receiving a first memory cell address for selecting a memory cell located in the first wordlines;

modifying the first memory cell address to select a memory cell located in the first wordlines which is physically closer to a wordline driver of the first set of wordline drivers;

receiving a second memory cell address for selecting a memory cell located in the second wordlines; and accessing memory cells at the second memory cell address without modifying the second memory cell address.

17. The method of claim 16 wherein the first memory cell address is modified by inverting the first memory cell address.

18. A method for writing data to an array of memory cells comprising:

receiving a sequence of X-bytes of data, wherein the X-bytes of data comprise Y-bytes of header data;

receiving addresses identifying locations in the memory for storing the X-bytes of data;

modifying the received addresses to store the Y-bytes of header data in memory cell locations which are physically closer to wordline driver circuits than memory cells identified by the received addresses.

* * * * *